United States Patent
Hsu et al.

(10) Patent No.: US 9,780,512 B2
(45) Date of Patent: Oct. 3, 2017

(54) CARD EDGE CONNECTOR

(71) Applicant: FOXCONN INTERCONNECT TECHNOLOGY LIMITED, Grand Cayman (KY)

(72) Inventors: Kuo-Chun Hsu, New Taipei (TW); Wen-Jun Tang, Kunshan (CN); Chin-Chu Tsai, New Taipei (TW); Jun Fang, Kunshan (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/390,743

(22) Filed: Dec. 27, 2016

(65) Prior Publication Data

US 2017/0187157 A1    Jun. 29, 2017

(30) Foreign Application Priority Data

Dec. 28, 2015   (CN) .......................... 2015 1 0988706

(51) Int. Cl.

| | |
|---|---|
| *H01R 13/648* | (2006.01) |
| *H01R 33/97* | (2006.01) |
| *H01R 13/641* | (2006.01) |
| *H01R 12/70* | (2011.01) |
| *H05K 5/02* | (2006.01) |
| *H05K 7/14* | (2006.01) |
| *H01R 12/72* | (2011.01) |
| *H01R 13/6587* | (2011.01) |

(52) U.S. Cl.
CPC ......... *H01R 33/97* (2013.01); *H01R 12/7005* (2013.01); *H01R 12/721* (2013.01); *H01R 13/641* (2013.01); *H01R 13/6587* (2013.01); *H05K 5/0295* (2013.01); *H05K 7/1404* (2013.01)

(58) Field of Classification Search
CPC .. H01R 33/97; H01R 13/641; H01R 13/6587; H01R 13/6594; H01R 12/7005; H01R 12/721; H05K 5/0295; H05K 7/1404
USPC ............... 439/327, 329, 607.35–607.41, 736
See application file for complete search history.

(56) References Cited

U.S. PATENT DOCUMENTS

| | | | | |
|---|---|---|---|---|
| 4,512,618 | A | * 4/1985 | Kumar ............... | H01R 23/6873 439/607.28 |
| 5,147,220 | A | * 9/1992 | Lybrand ............... | H01R 12/716 439/567 |
| 5,472,354 | A | * 12/1995 | Chen .................... | H01R 12/732 439/357 |

FOREIGN PATENT DOCUMENTS

| | | |
|---|---|---|
| CN | 2884569 | 3/2007 |
| CN | 202434788 | 9/2012 |

* cited by examiner

*Primary Examiner* — Khiem Nguyen
(74) *Attorney, Agent, or Firm* — Wei Te Chung; Ming Chieh Chang

(57) ABSTRACT

A card edge connector includes an insultive housing, a plurality of conductive terminals retained in the insultive housing and a metal frame retained in the insultive housing. The insultive housing defines two sidewalls extending along a longitudinal direction and two endwalls connected to the longitudinal ends of the sidewalls. The metal frame is integrally formed in the insulative housing and defines an elongated flat portion and a pair of fixing portions extending downwardly from both longitudinal ends of the flat portion, the flat portion is embedded into an upper portion of the insulative housing.

20 Claims, 6 Drawing Sheets

CARD EDGE CONNECTOR

BACKGROUND OF THE INVENTION

1. Field of the Invention

The present invention relates to a card edge connector, and more particularly to a card edge connector having a metal frame integrally formed therein.

2. Description of the Related Art

At present, a card edge connector is usually used for connecting an expansion card to a circuit board and includes an insulative seat and at least one ejector. The insulative seat defines a plurality of conductive terminals retained therein and a pair of tower portions located in both sides thereof. Each tower portion defines an accommodating space for receiving the corresponding ejector and a pair of pivot holes disposed on two sidewalls thereof, the ejector is pivotally connected to the pivot holes. The ejector is used for fixing the expansion card firmly in the card edge connector to prevent the signal from being interrupted by the vibration detachment. And the ejector defines an ejection mechanism, which can pull the expansion card out of the card edge connector. However, with the development of the electronic device requiring the relative complicated functions of the expansion card, the card edge connector can not support the heavier complicated expansion cards due to the material strength limitation of the insulative housing of the card edge connector. It is also noted that some prior design uses an upside-down U-shaped metallic shield attached upon the housing for the EMI (Electro-Magnetic Interference) shielding consideration. Anyhow, even using the metal structure associated with the insulative housing, such a design still fails to provide the sufficient reinforcement upon the housing for efficiently resisting the relatively heavier expansion cards.

Therefore, an improved card edge connector is highly desired to meet overcome the requirement.

BRIEF SUMMARY OF THE INVENTION

An object of the present invention is to provide a card edge connector having a metal frame integrally formed therein, which can enhance the load-bearing performance.

In order to achieve above-mentioned object, a card edge connector includes an insultive housing, a plurality of conductive terminals retained in the insultive housing and a metal frame retained in the insultive housing. The insultive housing defines two sidewalls extending along a longitudinal direction and two endwalls connected to the longitudinal ends of the sidewalls. The metal frame is integrally formed in the insulative housing via an insert-molding process and defines an elongated flat portion and a pair of fixing portions extending downwardly from both longitudinal ends of the flat portion wherein the flat portion is preferably embedded into an upper portion of the insulative housing.

Other objects, advantages and novel features of the invention will become more apparent from the following detailed description of the present embodiment when taken in conjunction with the accompanying drawings.

DESCRIPTION OF PREFERRED EMBODIMENT OF THE INVENTION

Figure 1:
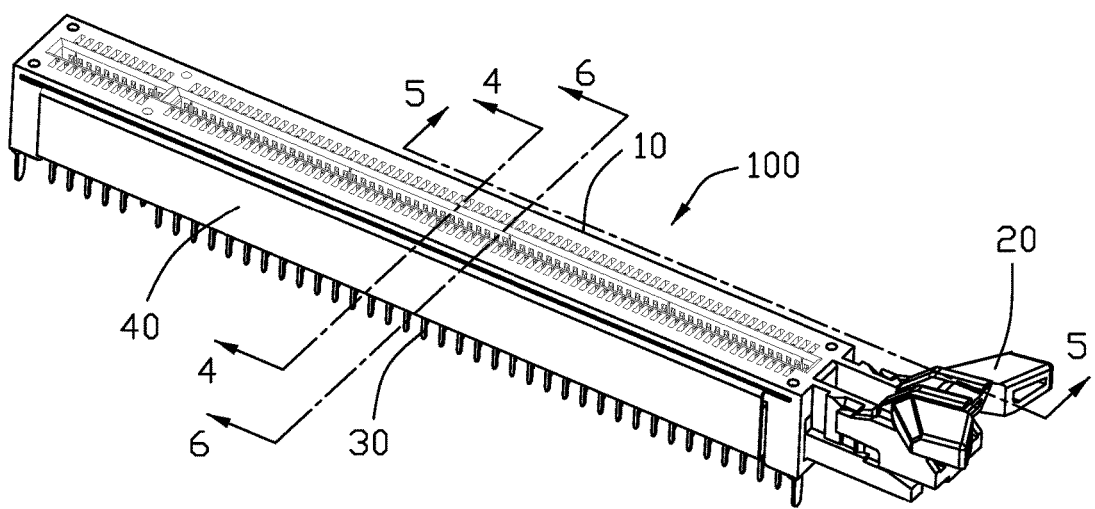
FIG. 1 is a perspective view showing a card edge connector in accordance with the present invention.
Figure 2:
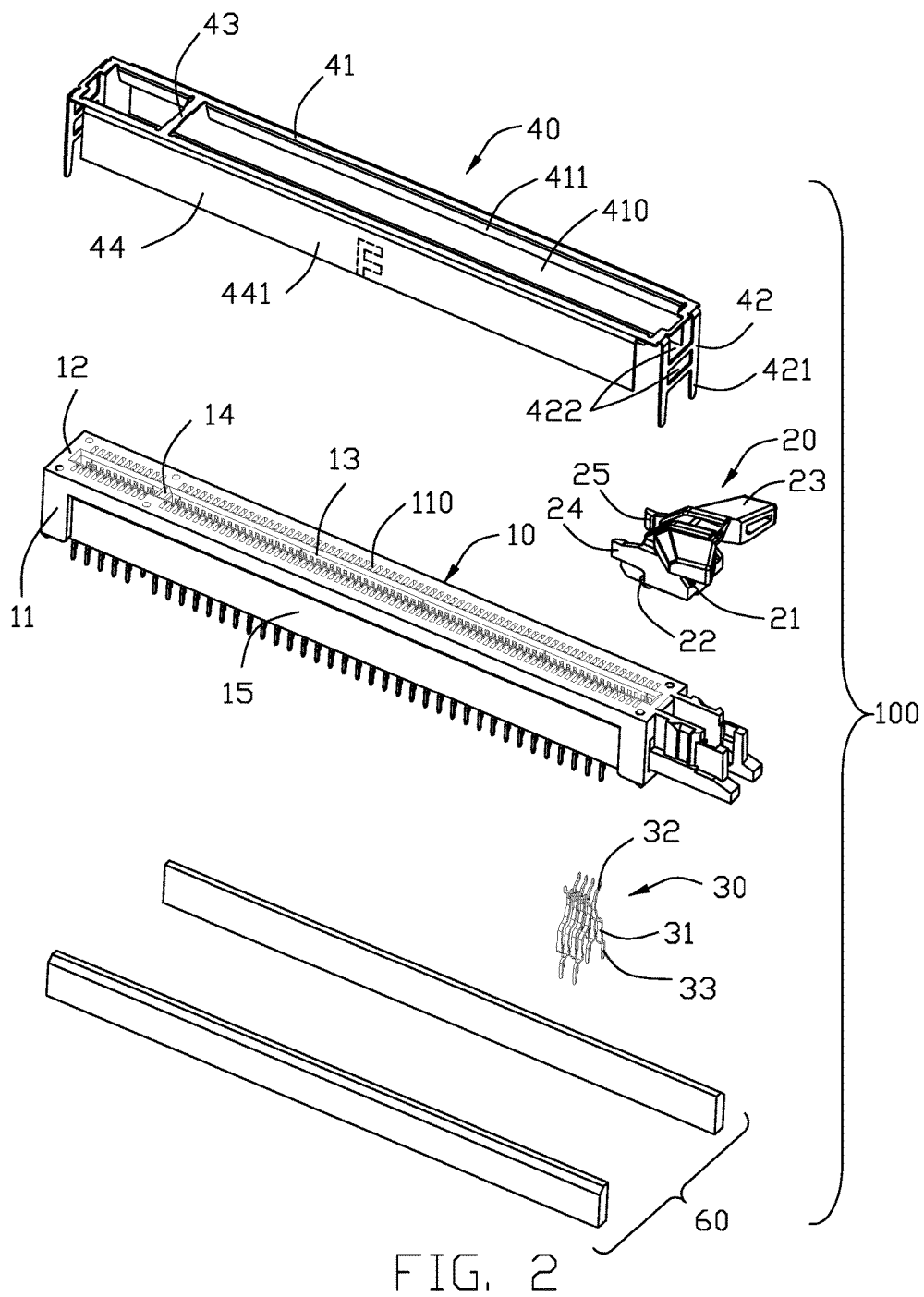
FIG. 2 is an exploded perspective view of the card edge connector shown in FIG. 1.

Reference will now be made to the drawing figures to describe a preferred embodiment of the present invention in detail. Referring to FIG. 1 to FIG. 2, a card edge connector 100 is used for an electronic card (not shown) inserted. The card edge connector 100 includes an elongated insulative housing 10, an ejector 20 disposed on a longitudinal side of the insulative housing 10, a plurality of conductive terminals 30 received in the insulative housing 10, and a metal frame 40 used for fixed the insulative housing 10 to a printed circuit board 50. The insulative housing 10 defines two sidewalls 11 extending along a longitudinal direction and two endwalls 12 connected to the longitudinal ends of the sidewalls 11, the sidewalls 11 and the endwalls 12 together form a central slot 13 used for receiving the electronic card. Each of the sidewalls 11 defines a plurality of terminal slots 110 used to receive the corresponding conductive terminals 30.

Figure 3:
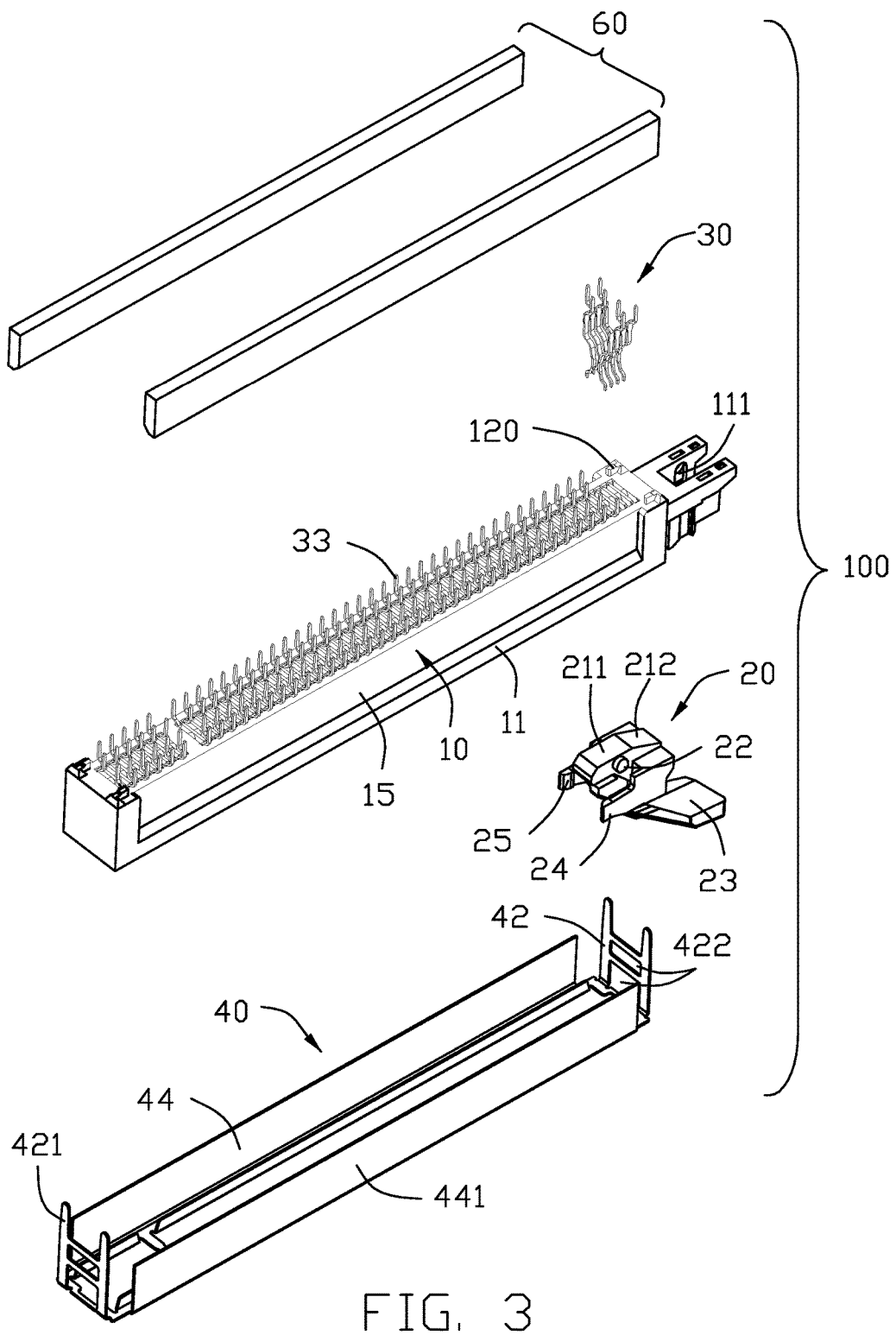
FIG. 3 is another exploded perspective view of the card edge connector shown in FIG. 1.

Referring to FIG. 2 to FIG. 3, the ejector 20 is made of a transparent material and defines a main portion 21, a pivot shaft 22 located below the main portion 21, a flip portion 23 disposed above the main portion 21 and extending away from the central slot 13, and a pair of clasping arms 24 disposed above the main portion 21 and extending toward the central slot 13. The clasping arm 24 defines a locking portion 25 at the free end thereof and used for locking the endwall 12. The insulative housing 10 defines a pivot hole 111 disposed on a longitudinal end thereof, which is corresponding to the pivot shaft 22. When the pivot shaft 22 is assembled to the pivot hole 111, the ejector 20 can be rotatable relative to the pivot shaft 22 in order to achieve locking and releasing operations of the electronic card inserted into the card edge connector 100.

Figure 5:
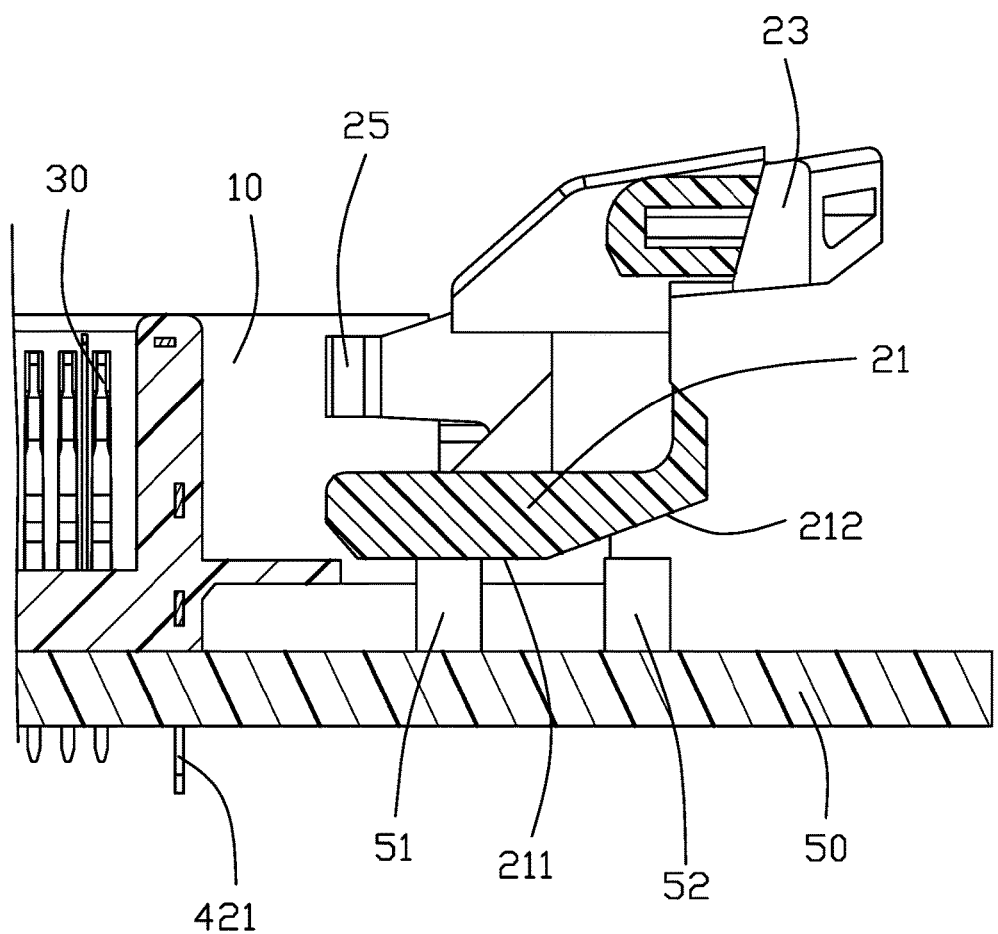
FIG. 5 is a partly cross-sectional view of the card edge connector, wherein the card edge connector is mounted on a printed circuit board.
Figure 6:
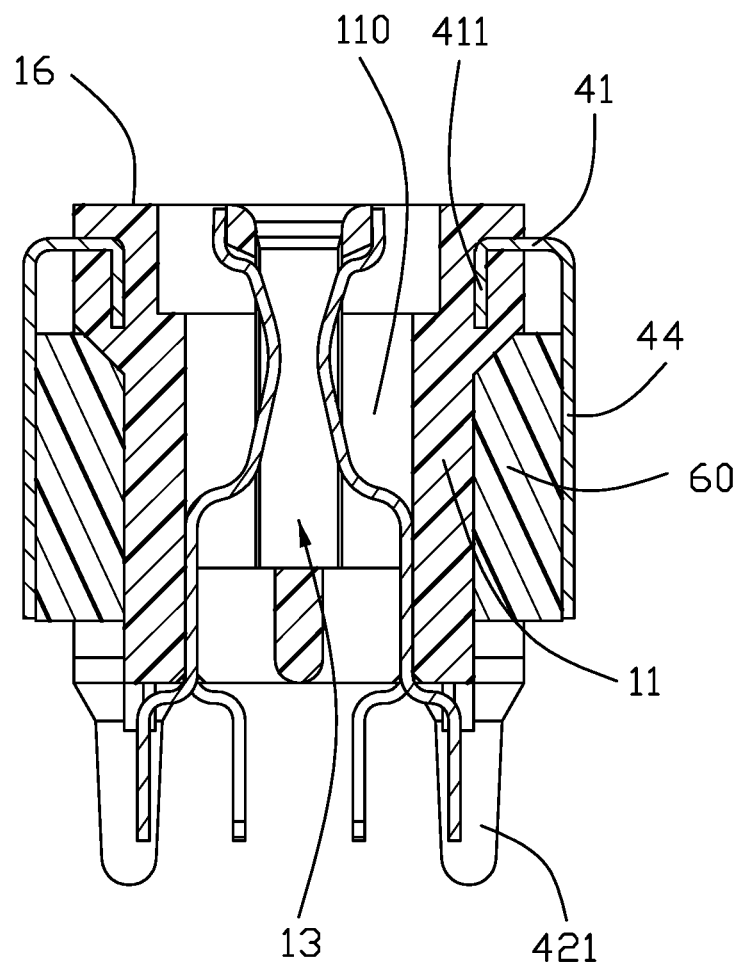
FIG. 6 is a cross-sectional view of the card edge connector along line 6-6 shown in FIG. 1 to show the flat portion is located beside the corresponding terminal slot in the transverse direction.

Referring to FIGS. 5 and 6, the ejector 20 defines a first light guide surface 211 and a second light guide surface 212 disposed on the bottom of the main portion 21. When the ejector 20 is in the closed state, the first light guide surface 211 is aligned with the first light source 51 and the light of the first light source 51 is conducted to the ejector 20. When the ejector 20 is in the open state, the second light guide surface 212 is aligned with the second light source 52 and the light of the second light source 52 is conducted to the ejector 20. The first light source 51 and the second light source 52 are LED lamps which are mounted on the printed circuit board 50 and can emit light in different colors. Thus, when the ejector 20 is operated to lock and release the electronic card, the light emitted by the LED lamp of different colors is irradiated into the ejector 20, in such a manner that the user can change the open/close state of the ejector 20 to achieve a change in the color of the ejector 20, so that the user can accurately understand the use state of the ejector 20.

The conductive terminals 30 are accommodated in the terminal slots 110, and each conductive terminal defines a retaining portion 31, a contacting portion 32 extending upwardly from the retaining portion 31 and projecting into the central slot 13, and a soldering portion 33 extending downwardly from the retaining portion 31 and outside of the insulative housing 10. When the electronic card is inserted into the card edge connector 100, the contacting portion 32 is electrically connected to the electronic card to achieve the electrical connection between the electronic card and the printed circuit board 50 by the soldering portion 33 welded to the printed circuit board 50.

Figure 4:
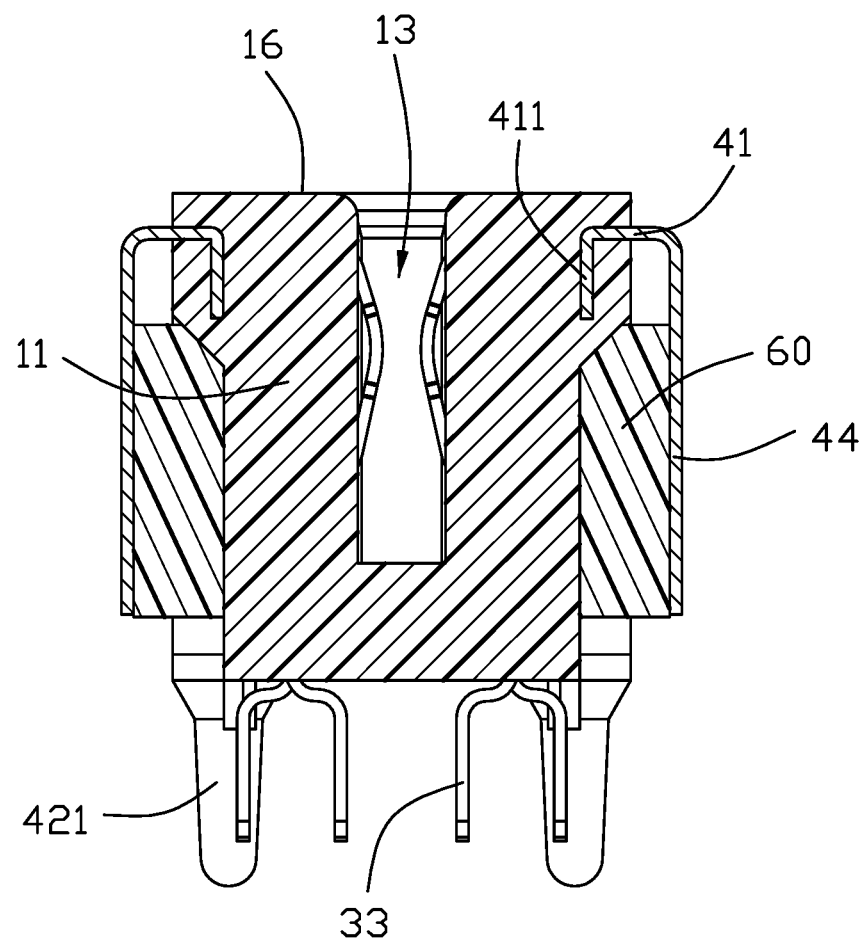
FIG. 4 is a cross-sectional view of the card edge connector taken along line 4-4 shown in FIG. 1.

Referring to FIG. 2 to FIG. 4, the metal frame 40 is formed by punching a sheet metal with the successive forming/bending procedure, and integrally formed in the insulative housing 10 via an insert-molding process. The metal frame 40 includes an elongated flat portion 41, a pair of fixing portions 42 extending downwardly from both longitudinal ends of the flat portion 41, and a pair of shielding plates 44 extending downwardly from the flat portion 41 in a direction perpendicular to the longitudinal direction. The flat portion 41 is inserted in an upper portion of the insulative housing 10 and defines an opening 410 corresponding to the central slot 13 and a pair of reinforcing ribs 411 extending downwardly from both lateral sides of the opening 410, the reinforcing ribs 411 are used to further increase the strength of the insulative housing 10. Each fixing portion 42 is embedded in the corresponding endwall 12 of the insulative housing 10 and defines a pair of retaining feet 421 extending outside of the insulative housing 10. The retaining feet 421 can be mated with and soldered on the printed circuit board 50 so as to make the card edge connector 100 fixed on the printed circuit board 50 to avoid peeling.

The shielding plates 44 of the metal frame 40 are located outside of the sidewalls 11 of the insulative housing 10 and each defines a light-transmitting hollow portion 441 as shown in FIG. 2 in which the hollow portion 441 forms a capital F as a symbol. A light guide plate 60 is defined between the shielding plate 44 and the sidewall 11, the light guide plate 60 is disposed in a lateral recess 15 of the sidewall 11 of the insulative housing 10 and defines an LED lamp (not shown) located in the bottom thereof. When the LED lamp emits light, the light emitted from the light source is guided to the hollow portion 441 of the shielding plate 44 through the light guide plate 60 and emitted outwardly from the hollow portion 441. The light-permeable hollow portion 441 can now display a distinctive mark of the product or form an aesthetically pleasing pattern. In this embodiment, the metal frame 40 has a pair of shielding plates 44, and a pair of light guide plates 60 used for transmitting the light to the hollow portion 441 are defined between the shielding plates 44 and the sidewalls 11 so as to display a distinctive mark or a beautiful pattern of the product. In other embodiments, the metal frame 40 may have no the shielding plate 44 so that there is no light guide plate 60 attached to the outerside of the sidewalls 11 of the insulative housing 10, if the user does not need a product mark or other pattern.

The insulative housing 10 further includes a key 14 located in the central slot 13 and biased toward one of the endwalls 12. The metal frame 40 defines a stopping portion 43 located in the opening 410 and corresponding to key 14 to prevent erroneous insertion of the electronic card. It is to be noted that each endwall 12 defines a pair of projections 120 disposed on the bottom thereof, and the retaining feet 421 of the metal frame 40 are running through the projections 120. And upon assembly, the projections 120 can be directly abutted against the printed circuit board 50 so that the metal frame 40 integrally formed in the insulative housing 10 has better stability.

In brief, one feature of the invention is to provide a metal frame 40 embedded within the insulative housing 10 via an insert-molding process before the terminals 30 are inserted into the corresponding terminal slots 110, respectively, wherein the metal frame 40 includes at least a pair of shielding plates 44 applied upon the corresponding longitudinal side walls 11 so as to provide not only the shielding function in a transverse direction perpendicular to the longitudinal direction, but also a reinforcing function for supporting the corresponding side walls against the relatively heavy module inserted into the central slot 13. Notably, in the disclosed embodiment the metal frame 40 is required to be bent/formed in its final shape beforehand so as to be insert-molded within the insulative housing.

It is also noted that in this embodiment on one hand, the flat portion 41, from which the shielding plates 44 extend downwardly, extends in a horizontal plane extending parallel to and hidden under the top surface 16 of the housing 10. On the other hand, for consideration of the injection molding of the housing 10, the terminal slot 110 requisitely extends through the housing 10 in the vertical direction and thus is located beside the flat portion 41 in the transverse direction. Because the inner side portion of the flat portion 41 and the reinforcing rib 411 are embedded within the housing 10, the whole metal frame 4 can be efficiently secured with the housing 10, thus providing a relatively strong structure of the whole connector 100 for supporting the relatively heavier daughter card.

Understandably, in some other type card edge connectors, because the transverse dimension of the housing is relatively small, no space is available for mounting the flat portion but only the pair of fixing portions 42 and the shielding plates 44 may exist to surround the housing 10. In such a condition, such fixing portions 42 and shielding plates 44 may exist individually and discrete from one another without linkage therebetween, or transversely linked with one another instead of linking via the inexistent flat portion. From a technical viewpoint, in this embodiment the fixing portion 42 forms lateral openings 422 (the opening formed in a vertical plane and facing in either the longitudinal direction or transverse direction) in which the material of the housing 10 is filled, thus enhancing securing between the housing 10 and the metal frame 4. In this embodiment, the shielding plate 44 is transversely exposed to an exterior upon the light guide plate 60 for easy identification. Anyhow, in other alternate embodiment, no light guide plate exists and the shielding plate 44 may be embedded within the corresponding side wall 11 without transverse exposure to the exterior.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the board general meaning of the terms in which the appended claims are expressed.

What is claimed is:
1. A card edge connector comprising:
an insultive housing defining two sidewalls extending along a longitudinal direction and two endwalls connected to longitudinal ends of the sidewalls;
a plurality of conductive terminals retained in the insultive housing; and a metal frame retained with the insulative housing; wherein the metal frame is integrally formed in the insulative housing via an insert-molding process, and defines an elongated flat portion and a pair of fixing portions extending downwardly from both longitudinal ends of the flat portion, and the flat portion is hidden and embedded into an upper portion of the insulative housing.

2. The card edge connector as described in claim 1, wherein each fixing portion is embedded within the corresponding endwall of the insulative housing and defines a pair of retaining feet extending downwardly outside of the insulative housing.

3. The card edge connector as described in claim 2, wherein each endwall defines a pair of projections disposed on the bottom thereof, and the retaining feet of the metal frame are running through the projections.

4. The card edge connector as described in claim 2, wherein the sidewalls and the endwalls together form a central slot for receiving an electronic card, the flat portion defines an opening corresponding to the central slot and a pair of reinforcing ribs extending downwardly from both lateral sides of the opening.

5. The card edge connector as described in claim 4, wherein the insulative housing further includes a key located in the central slot and biased toward one of the endwalls, the metal frame defines a stopping portion located in the opening and corresponding to the key.

6. The card edge connector as described in claim 1, wherein the metal frame includes a pair of shielding plates extending downwardly from the flat portion in a direction perpendicular to the longitudinal direction, the shielding plates of the metal frame are located outside of the sidewalls of the insulative housing.

7. The card edge connector as described in claim 6, wherein a light guide plate is defined between the shielding plate and the sidewall and the shielding plate forms a light-transmitting hollow portion, the sidewall defines a lateral recess disposed in the outside thereof, and the light guide plate is located in a lateral recess of the sidewall.

8. The card edge connector as described in claim 1, wherein the card edge connector further includes an ejector disposed on a longitudinal side of the insulative housing, the ejector is made of transparent material and defines a first light guide surface and a second light guide surface disposed on the bottom thereof, when the ejector is in the closed state, the first light guide surface is aligned with a first light source and the light of the first light source is conducted to the ejector, when the ejector is in the open state, a second light guide surface is aligned with the second light source and the light of the second light source is conducted to the ejector.

9. The card edge connector as described in claim 8, wherein the first light source and the second light source are LED lamps which can emit light in different colors.

10. A card edge connector comprising:
an insulative housing including a pair of side walls extending along a longitudinal direction, and a pair of end walls extending along a transverse direction perpendicular to the longitudinal direction, and a center slot extending along the longitudinal direction between said pair of side walls in the transverse direction and upwardly exposed to an exterior in a vertical direction perpendicular to both said longitudinal direction and said transverse direction;
a plurality of terminal slots formed in each of said side walls;
a plurality of conductive terminals disposed in the corresponding terminal slots, respectively; and
a metallic frame including a pair of shielding plates each extending in a vertical plane along the corresponding side walls, respectively, wherein
said metallic frame is insert-molded with the housing and forms at least one lateral opening filled with material of the housing.

11. The card edge connector as claimed in claim 10, wherein the metallic frame further includes a flat portion parallel to a top surface of the housing, the terminal slots extending through the top surface so as to have the flat portion located beside said terminal slots in the transverse direction.

12. The card edge connector as claimed in claim 11, wherein said flat portion extends in a horizontal plane which is parallel to and under the top surface, and the shielding plate extends downwardly from an outer side of the flat portion.

13. The card edge connector as claimed in claim 11, wherein said flat portion further includes a reinforcing rib extending downwardly from an inner side of the flat portion opposite to the corresponding shielding plate.

14. The card edge connector as claimed in claim 10, wherein said lateral opening is formed in a fixing portion of the metal frame, and said fixing portion extends in a vertical plane which is parallel to and located behind an exterior surface of the corresponding end wall.

15. The card edge connector as claimed in claim 14, wherein said metal frame further includes a flat portion parallel to a top surface of the housing, and the fixing portion extends downwardly from the flat portion in the vertical direction.

16. The card edge connector as claimed in claim 10, wherein said metal frame further includes at least one retaining feet extending downwardly in the vertical direction beyond a bottom face of the housing for mounting to a printed circuit board on which the connector is mounted.

17. A card edge connector assembly comprising:
an insulative housing including a pair of side walls extending along a longitudinal direction, and a pair of end walls extending along a transverse direction perpendicular to the longitudinal direction, and a center slot extending along the longitudinal direction between said pair of side walls in the transverse direction and upwardly exposed to an exterior in a vertical direction perpendicular to both said longitudinal direction and said transverse direction;
a plurality of terminal slots formed in each of said side walls;
a plurality of conductive terminals disposed in the corresponding terminal slots, respectively;
a metal frame associated with the said housing and including a pair of shielding plates corresponding to said pair of side walls, respectively; and
a pair of light guide plates located between the corresponding side walls and shielding plates, respectively, in the transverse direction; wherein
light directed by the corresponding light guide plate, is viewable in the transverse direction through a corresponding light-transmitting hollow portion in the corresponding shielding plate.

18. The card edge connector as claimed in claim 17, wherein said metal frame is insert-molded with the housing and forms a lateral opening in which material of the housing is filled.

19. The card edge connector as claimed in claim 17, wherein said metal frame includes a flat portion extending in a horizontal plane parallel to and under a top surface of the housing.

20. The card edge connector as claimed in claim 17, further including an transparent rotatable ejector located around one of the end walls and defining a first light guide surface and a second light guide surface around a bottom side thereof; wherein said first light guide surface and said second light guide surface is spaced from each other in the longitudinal direction so as to have the first light guide surface downwardly facing and coupled with a first light source mounted upon a printed circuit board on which the connector is mounted, when the ejector is moved to a locking position, and to have the second light guide surface downwardly facing and coupled with second light source mounted upon said printed circuit board when the ejector is moved to an opening position, said first light source and said second light source having different colors from each other.

* * * * *